United States Patent [19]
Goff et al.

[11] Patent Number: 5,153,841
[45] Date of Patent: Oct. 6, 1992

[54] METHOD OF AND APPARATUS FOR SEMI-CONDUCTOR WAFER SELECTION

[75] Inventors: Gerald L. Goff; Michael L. Muecke, both of Austin, Tex.

[73] Assignee: Advanced Micro Devices, Austin, Tex.

[21] Appl. No.: 616,370

[22] Filed: Nov. 21, 1990

[51] Int. Cl.⁵ .................. G05B 15/46; B65G 65/30
[52] U.S. Cl. ................. 364/478; 364/167.01; 414/416; 414/417; 414/404
[58] Field of Search ............ 364/478, 552, 167.01; 414/227, 331, 404, 416, 417, 403, 411, 750, 751

[56] References Cited

U.S. PATENT DOCUMENTS

| | | | |
|---|---|---|---|
| 4,466,766 | 8/1984 | Geren et al. | 414/464 |
| 4,493,606 | 1/1985 | Foulke et al. | 414/416 |
| 4,568,234 | 2/1986 | Lee et al. | 414/416 |
| 4,597,708 | 7/1986 | Wheeler et al. | 414/416 |
| 4,699,556 | 10/1987 | Foulke | 414/416 |
| 4,775,281 | 10/1988 | Prentakis | 414/416 |
| 4,840,530 | 6/1989 | Nguyen | 414/417 |
| 4,856,957 | 8/1989 | Lau et al. | 414/417 |

OTHER PUBLICATIONS

MGI Systems' Expanding The Horizons of Technology, Phoenix Series V2 Wafer Management Systems Brochure.
MGI Systems' Quartz Carriers, A Continued Standard of Excellence Brochure.
Cybeq Systems' Model 2200 PB Indexer with Pusher Bar Brochure.
H-Square Company's Wafer Transfer System HQ-414 Brochure.
MGI Systems' E.T., A Cost Effective Solution to Your Wafer Transfer Needs Brochure.

Primary Examiner—Jerry Smith
Assistant Examiner—Paul Gordon
Attorney, Agent, or Firm—Johnson & Gibbs

[57] ABSTRACT

A method and apparatus for lifting select semi-conductor wafers from a quartz wafer boat. A removable transfer platform is provided for receiving a quartz wafer boat and positioning the wafer boat above upwardly extending fingers adapted for engaging wafers disposed therein. The upwardly extending wafer engagement fingers are mounted on a wand that is programmed for select vertical and horizontal movement relative to the wafer boat. The fingers of the wand also include ends adapted for engaging the peripheral edges of the wafer supported within the wafer boat for being lifted therefrom.

20 Claims, 5 Drawing Sheets

METHOD OF AND APPARATUS FOR SEMI-CONDUCTOR WAFER SELECTION

BACKGROUND OF THE INVENTION

1. Field of the Invention

The present invention relates to semi-conductor wafer handling equipment, and, more particularly, to a method of and apparatus for selectively removing semi-conductor wafers from quartz processing boats.

2. History of the Prior Art

In the manufacture of semi-conductor devices, such as integrated circuits, a plurality of devices are formed on a single wafer of silicon material. Each wafer is typically circular and on the order of 6 inches in diameter. The wafers are put through a number of sequential processing steps, including coating them with photoresists, exposing them to the optical patterns formed on photo masks, exposing them to both liquid and gaseous treating environments, and passing them through high temperature baking operations.

The processing of a silicon wafer containing a plurality of semi-conductor devices requires a high degree of cleanliness and sterility in the environment in order to produce acceptable devices. The ability of a semi-conductor device to perform satisfactorily from both an electrical and a mechanical standpoint depends upon the nature and quality of the materials forming the various layers of the device. The chemical composition of these materials must be extremely pure. The introduction of any foreign matter into the environment where the wafers are being processed results in a decrease in the "yield" of the wafer. The yield is the number of devices that can pass the required electrical tests of the device after the processing has been completed. This is usually expressed as a fraction of the total number of devices processed on the wafer that did pass the required tests. Thus, the higher the purity of the processing environment and the processing and wafer handling techniques used in manufacturing the semi-conductor devices, the greater the yield and hence the greater the finanical return to the manufacturer.

The semi-conductor wafers are generally handled between processing steps in inert plastic frames containing a plurality of vertically arranged dividers. Each divider defines a pocket to receive a silicon wafer and holds it securely in a vertical orientation while isolating it from adjacent wafers. The plastic frame and its dividers are together referred to as a wafer "cassette." A typically industrial cassette may hold on the order of 25 wafers for processing. The cassettes are physically moved by operators from one processing station to another wherein the cassettes are placed in indexing mechanisms that generally form a part of the processing machinery of each station. Each wafer is then automatically removed from the cassette for processing and returned by the indexing mechanism after the processing step of each station has been completed.

It is sometimes necessary during the processing operation to occasionally remove selected wafers from the cassette in order to perform quality assurance tests, to read a serial number on a wafer, or for other production or quality control reasons. In conventional wafer cassettes holding on the order of 25 wafers, there is generally sufficient spacing between adjacent wafers for an operator to grip a single wafer along its edge with a pair of tweezers or a "vacuum wand." In this manner, the wafer may be gently removed from the cassette for inspection or testing. Removing an individual wafer from a cassette is a very delicate operation because a wafer can only be touched along a small area within approximately ⅛" from its edge. This is necessary in order to avoid physically damaging the semi-conductor devices, referred to as "dies," being formed on the wafer. In addition, if the surface of a wafer touches any of the adjacent wafers during the removal operation, scratches can occur, resulting in destruction of one or more of the dies being formed on the wafer and, thus, reducing the yield of the wafer.

During certain manufacturing operations, the semi-conductor wafers being processed are kept very close together, i.e., closer to one another than in the above described conventional wafer cassettes. For example, in a baking operation in which the temperature of the oven may be raised to the order of 1800 degress Celsius, the wafers are kept very close together for even heat distribution across the entire group of the wafers being processed. It is generally required that, because of the high degree of control necessary in certain processes, there be temperature variations of no more than 5 degrees Celsius between any one of the adjacent wafers being processed. The more closely the wafers are packed together, the higher the probability that they will all be raised to the same temperature, resulting in a high degree of homogeneity in the baking processing step.

In order to carry semi-conductor wafers through a high temperature baking operation, such as that described above, the wafers must be placed in a specially designed carrier that is generally referred to as a quartz "boat." The quartz boat is designed to withstand high temperatures and also provide a high degree of stability in supporting the wafers so that there is relatively little chance that any one of the tightly packed wafers will touch an adjacent wafer. Boats formed of precisely machined quartz glass material are generally employed for such processing steps. However, when semi-conductor wafers are packed extremely close together in such a processing boat, spacing therebetween can be reduced to the order of 1/32". It thus becomes virtually impossible for even the most skilled operator to selectively remove any one wafer from the group by conventional techniques in order to inspect and/or test it without scratching the surface of an adjacent wafer. Selective removal of the wafers for testing, such as batch baking, is very important to insure that the processing of the dies on the multiple wafers was successful. In the event some error in the processing operation through which the wafer has just passed is not revealed until after the wafers have been subsequently sent through additional processing steps, substantial expense will be incurred to treat the defective wafers. In addition, it is important to know if a processing step is not working properly in order to avoid processing additional wafers through that step without making the necessary adjustments and/or taking corrective action.

Prior art techniques have sought to provide automatic equipment for engaging select wafers from tightly packed groups in a carrier. These techniques generally include gripping a wafer from the top and then very accurately removing it from between adjacent wafers. Such systems have inherent disadvantages. Anytime a wafer is gripped in order to lift it from a carrier, both substantial contact and pressure are applied to the wafer as it is pulled upwardly. Any increase in the area of contact with the wafer or pressure on the wafer has been shown to result in a release of contaminating particles and related impurities from the equipment. These impurities would move downwardly onto the surface of the wafer and contaminate one or more of them. It has also been shown that when metal or plastic comes in contact with the wafer the friction between the surfaces alone causes contamination.

Other prior art systems have sought to lift select wafers from below the cassette and raise the wafer upwardly from within their neighboring wafers for facilitating the requisite access thereto. Such systems have not, to date, proven to be sufficiently accurate to provide a practical solution to the problems enumerated above. In addition, the high degree of accuracy necessary for removing wafers from the tightly packed boats requires a high degree of precision in the positioning of the boat with respect to the handling equipment. This aspect alone has limited the accuracy of certain prior art systems.

It would thus be desirable to provide a system for selectively removing semi-conductor wafers from a tightly packed processing boat without the need to grip the wafers from above or apply any undue pressure to them. In addition, it would be desirable to have the system programmable to selectively remove a particular wafer from a group of wafers regardless of the spacing between them, the centers upon which they are located, or the size and configuration of the processing boat within which they are being handled. It would also be an advantage to be able to quickly and accurately remove each wafer for testing purposes with a minimum of contamination of the wafers.

SUMMARY OF THE INVENTION

The present invention pertains to a method of and apparatus for removing select wafers from tightly packed wafer carrying boats for testing and/or inspection. In one aspect, the invention includes a removable wafer selection wand which is transportable in both the horizontal and vertical directions and is located beneath a changeable cassette support platform for receiving various configurations of wafer carrying cassettes. The cassette removal wand is moved by means of a pair of horizontal and vertical stepper motors which are driven in accordance with a programmable control to accurately position the wand beneath selected ones of the cassettes within the boat and then securely and gently lift the wafer from within the cassette and return it to its position within the cassette.

In another aspect, the invention includes a system for selectively removing a semi-conductor wafer from a wafer boat of the type having a framework for the underlying support of the wafers. The system comprises a transfer platform adapted for receiving and matingly engaging the wafer boat from which the wafers are to be selectively removed. A wafer selection wand is adapted for horizontal and vertical positioning relative to the transfer platform. Means are provided for mounting the transfer platform above the wand in a select horizontal and vertical relationship therewith. Means are provided for horizontally positioning the wand at a select position relative to the platform mounted thereabove and for vertically positioning the wand a select vertical position relative to the platform mounted thereabove. Means are also provided for controlling the select horizontal and vertical positioning means. A plurality of fingers are then disposed on the wand, the fingers being adapted for passing through the wafer boat framework and having end configurations adapted for engaging the edges of a semiconductor wafer supported therein.

In another aspect, the invention described above includes the positioning means disposed within a housing, the housing having an upper horizontal surface constructed with an opening therein adapted for receiving the transfer platform in secured engagement. The transfer platform further includes at least one bar extending across the aperture, the bar being constructed with a recess therein adapted for receiving the wafer boat framework in mating engagement.

The horizontal positioning means may also include a platform mounted for horizontal movement upon a drive screw while the vertical positioning means comprises a vertical drive screw mounted upon the platform with a transfer carriage in threaded engagement therewith. Both horizontal and vertical movement of the wand is thus provided for reliably and accurately lifting select wafers from select wafer boats.

BRIEF DESCRIPTION OF THE DRAWINGS

For an understanding of the present invention and for further objects and advantages thereof, reference may now be had to the following description taken in conjunction with the accompanying drawings, in which.

DESCRIPTION OF THE PREFERRED EMBODIMENT

Figure 1:
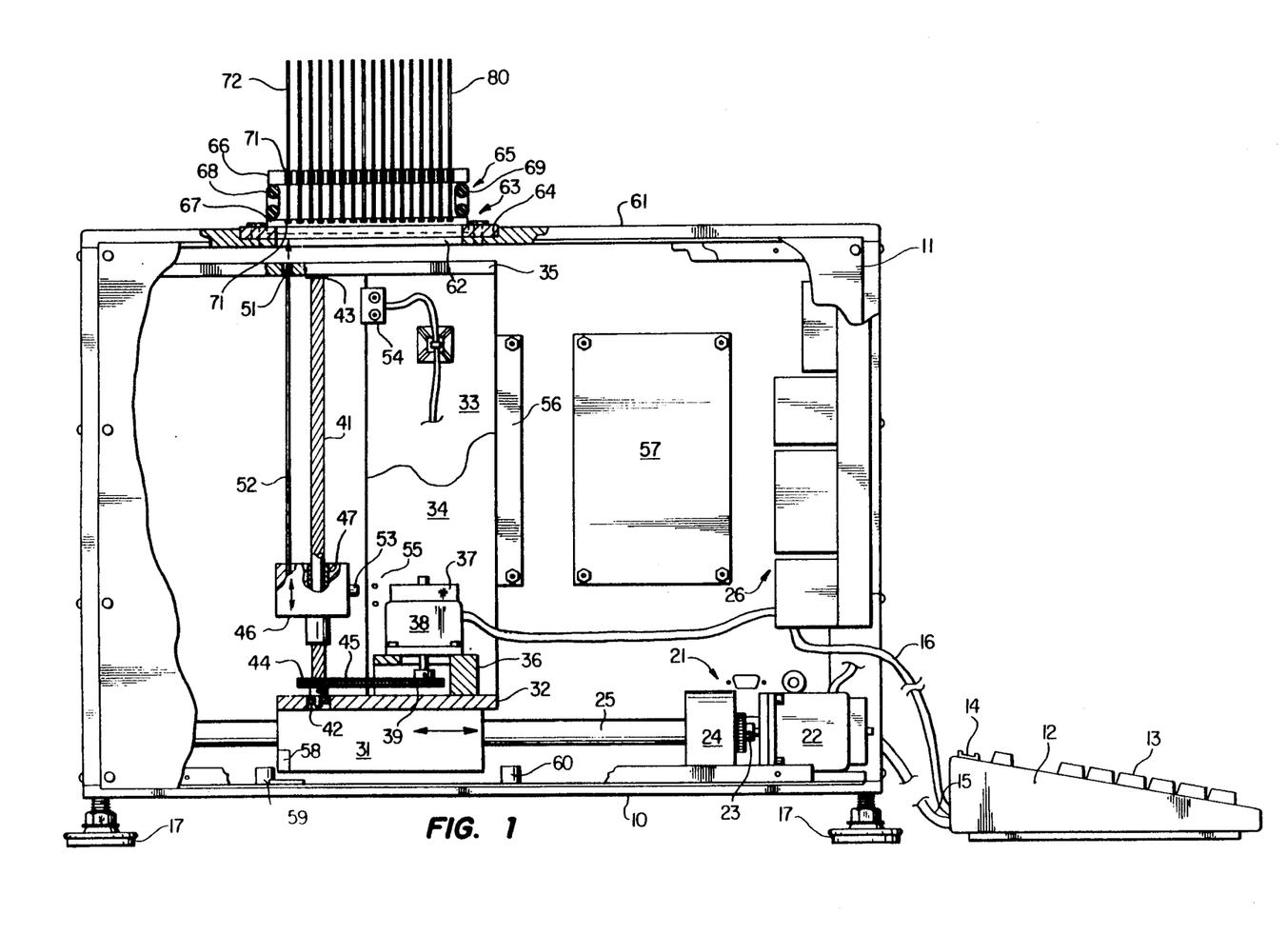
FIG. 1 is a partially cut-away side view of a semi-conductor wafer selection system constructed in accordance with the teachings of the present invention.

Referring to FIG. 1, there is shown a cut away side view of a cassette selection system constructed in accordance with the teachings of the present invention. The system includes an outer framework 10 about which a cabinet 11 is constructed for enclosing the system to reduce the possibility of contamination due to movement of internal parts in an area near to the semi-conductor wafers. A control console 12, including an input keyboard 13 and a monitoring display 14, is connected to the system by means of a pair of control cables 15 and 16. The cabinet 11 is supported above a planar surface by means of feet 17 which are adjustable for precise leveling of the cabinet.

Mounted to the framework 10 within the interior of the cabinet 11 is a stationary horizontal drive array 21 which includes a horizontal stepper motor 22 having a drive shaft 23 connected to a gear box 24 to rotate a horizontal drive screw 25. The motor 22 is connected to stepper motor drive circuitry 26 located within the cabinet 11.

Movably mounted to the horizontal drive screw 25 is a carrier platform 31 to which is attached a mounting frame 32, vertical support plates 33 and 34, and an upper transversely extending support plate 35. The horizontal and vertical support plates are rigidly mounted to one another to provide a highly stable framework for accurate operation of the present wafer selection system.

The lower horizontal support plate 32 has attached to its upper surface a motor mount 36 upon which is affixed a vertical driving stepper motor 37 having an output shaft 38 and a toothed drive wheel 39. Mounted for rotation between the upper and lower horizontally extending support plates 32 and 35 is a vertical drive screw 41. The lower end of the vertical drive screw 41 includes a lower drive bearing 42, and an upper drive bearing 43 positioned in the upper support plate 35. The lower end of the vertical drive screw 41 includes a toothed drive gear 44 rigidly fixed to the screw. A timing belt 45 connects the drive gear 39 on the end of the drive shaft 38 of the vertical stepper motor 37 to the drive gear 44 mounted on the vertically extending drive screw 41 for precise rotation one with the other. A vertically movable support block 46 includes a precision nut 47 which engages the threads of the vertical drive screw 41 for movement in the vertical direction in response to rotation of the screw. That is, rotation of the vertical drive screw 41 in one direction causes upward movement of the support block 46, while rotation of the vertical drive screw 41 in the opposite direction causes downward movement of the support block 46. The upper horizontal support plate 35 includes an elongate slot 51 which receives the upper end of a wafer handling wand 52, the lower end of which is rigidly affixed into the upper surface of the support block 46. The support block 46 also includes a Hall-effect device 53 mounted on the side thereof for cooperative relationship with Hall-effect sensors 54 and 55 located at the upper and lower ends, respectively, of the extent of the travel of the block 46 for sensing the zero positions of the block and for transmitting such information to the control circuitry 56 and 57. It should be noted that another Hall-effect device 58 is similarly sensed by Hall-effect sensors 59 and 60 at the outer extent of movement of the support platform 31 to transmit such information to the control circuitry 56 and 57 for resetting of the programming for controlling the system.

The upper surface 61 of the cabinet 11 has an opening 62 formed therein within which is positioned a wafer cassette transfer platform 63. As shown, the opening 62 includes peripheral mounting edges 64 within which can be received a cassette transfer platform 63 having a plurality of different configurations in order to accept wafer cassette carriers of different configurations. This enables the system of the present invention to be readily adapted to handling various cassettes and/or different carriers having a variety of spacing between wafers and/or wafer support bar configurations.

Still referring to FIG. 1, there is shown a particular configuration of a quartz wafer handling boat 65 adapted for extremely high temperature operations such as semi-conductor wafer baking. The carrier 65 comprises a plurality of longitudinally extending quartz bars 66 and 67 which are held together by transversely extending quartz bars 68 and 69. The longitudinal bars include a plurality of slits 71 which are formed therein in alignment with one another so as to receive approximately ⅛" of the outer peripheral edge of a semi-conductor wafer 72 positioned therein. The wafer 72 is therein positioned in precise parallel spaced alignment with respect to adjacent ones of the semi-conductor wafers 72 positioned within the boat 65. As seen in FIG. 1 the boat 65 and wafers 72 are shown in vertical cross section to illustrate the manner in which the wafers are supported and the close proximity of the wafers one to the other.

Figure 2:
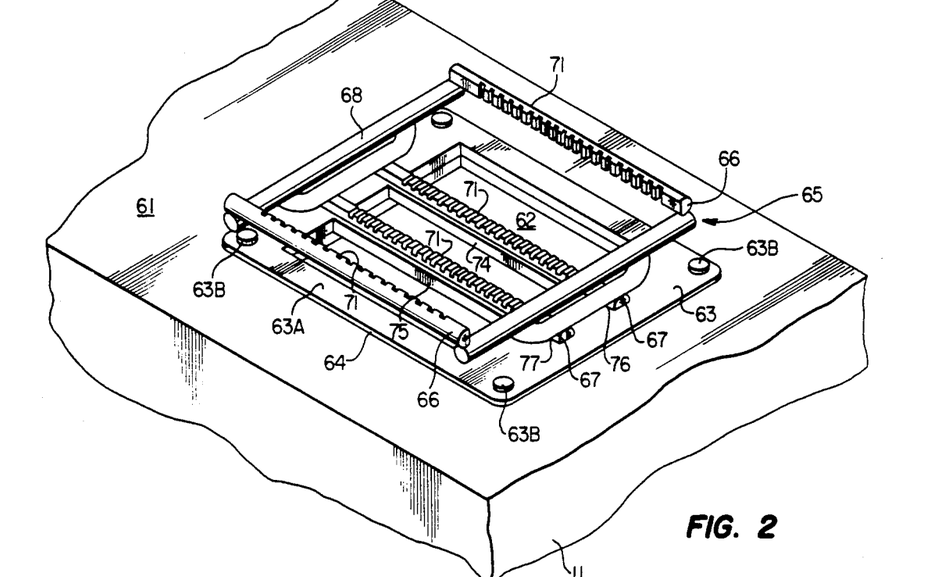
FIG. 2 is a perspective view of the wafer cassette transfer platform located on top of the system of FIG. 1, having a quartz cassette positioned thereon.

Referring now to FIG. 2 there is shown a perspective view of the upper surface 61 of the cabinet 11 containing the system of the present invention and which illustrates the modular, removable framework of the cassette transfer platform 63. As shown in FIG. 2, the transfer platform 63 is positioned within the opening 62 in the upper surface 61 of the cabinet 11. The platform 63 includes a generally planar body section 63A and a pair of longitudinally extending bars 74 and 75 into which are formed a pair of recesses 76 and 77 of longitudinal and transverse dimensions precisely aligned to receive the lower edges of the longitudinally extending quartz wafer cassette bars 67. A plurality of securement pins 63B secure the platforms 63 within the mounting edges 64 and relative to the horizontal drive array 21. Like the outer longitudinal bars 66, the inner longitudinal bars 67 have precisely formed slots 71 therein for receiving the outer edges of a semi-conductor wafer and positioning that wafer within the boat 65 in parallel spaced relationship with all other wafers therein to insure that the wafer does not touch any one of said wafers adjacent thereto. Thus it can be seen that due to the precise machining of each slot 71 within the longitudinally extending bars 66 and 67, and the precise machining of the recesses 76 and 77 within the longitudinally extending bars 74 and 75 of platform 63, each wafer in each slot 71 will be precisely positioned relative to the wafer selection mechanism including horizontal drive array 21 within the cabinet 11. It should be understood that other forms of cassette transfer platforms 63 similarly constructed to receive a particular configuration of semi-conductor wafer boats 65 may be substituted in the opening 62 and be received by the peripheral mounting edges 64.

Figure 3:
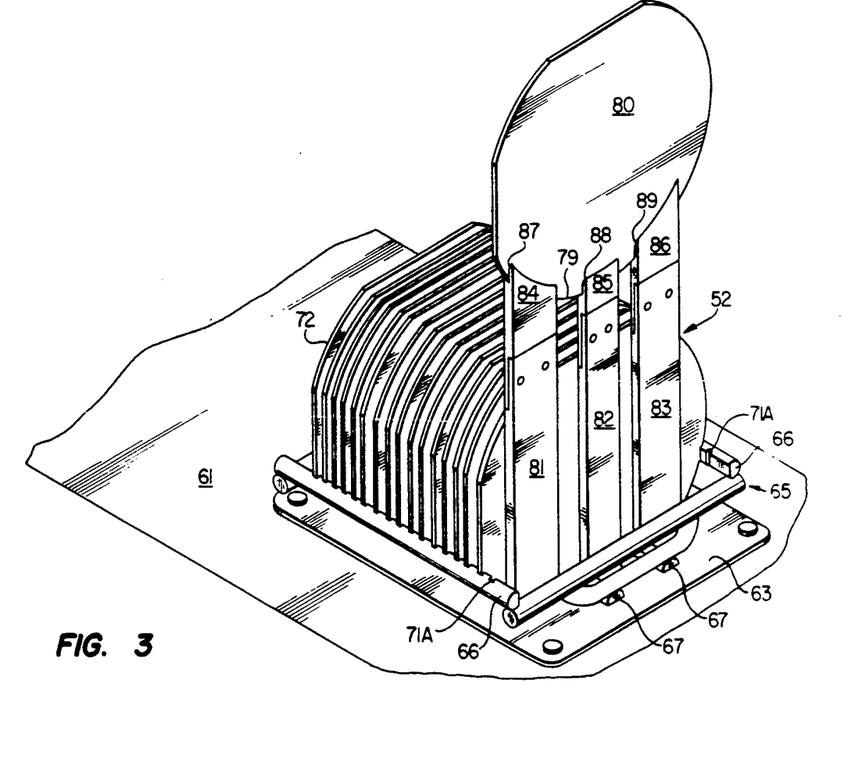
FIG. 3 is a top perspective view of the wafer cassette transfer platform having a cassette full of wafers positioned thereon and the selection system of the present invention having elevated a wafer from within the cassette.

Referring now to FIG. 3 there is shown the same upper surface of the cabinet 61 and semi-conductor wafer cassette 65 but with a plurality of semi-conductor wafers 72 being positioned therein and the semi-conductor wafer selection wand 52 having removed a particular semi-conductor wafer 80 from a select slot within an aligned array of slots 71A and elevated that wafer above the others for inspection and/or testing. The semi-conductor selection wand 52 shown in FIG. 3 comprises a plurality of elongate fingers 81-83 which extend upwardly in generally parallel spaced relationship through the space 62 in the upper surface 61 of the cabinet 11 to engage the lower edges of semi-conductor wafers 79 positioned within boat 65 mounted on the transfer platform 63. The spacing between the fingers 81-83 of the wand 52 are such that they receive between them the mounting bars 74 and 75 and the elongate support members 67 of the quartz boat 65. It should be clear that the spacing and arrangement of the fingers 81-83 would be configured for different configurations of boat 65 and the requisite mounting platforms 63.

Still referring to FIG. 3, the ends of the fingers 81-83 are formed by a plurality of slotted contactors, or wafer engagement blades, 84-86 attached, respectively, to the upper ends thereof. The upper end of each of the contactors 84-86 have edges configured along a circular array so as to receive the circular edges of the semi-conductor wafer. In addition, the upper ends of the edges of the contactors 84-86 include circular slots 87-89 having a depth of less than $\frac{1}{8}''$ so as to contact only the outer $\frac{1}{8}''$ edge of the wafer and avoid any damage to dies formed upon the wafer. The spacing between the sides of the slots 87-89 is such to securely support the wafer 80 and avoid any transverse movement thereof. This design prevents the wafer 80 from contacting adjacent wafers 72 as it is lifted upwardly by the contactors 84-86 from within the array of wafers 72.

Figure 4:
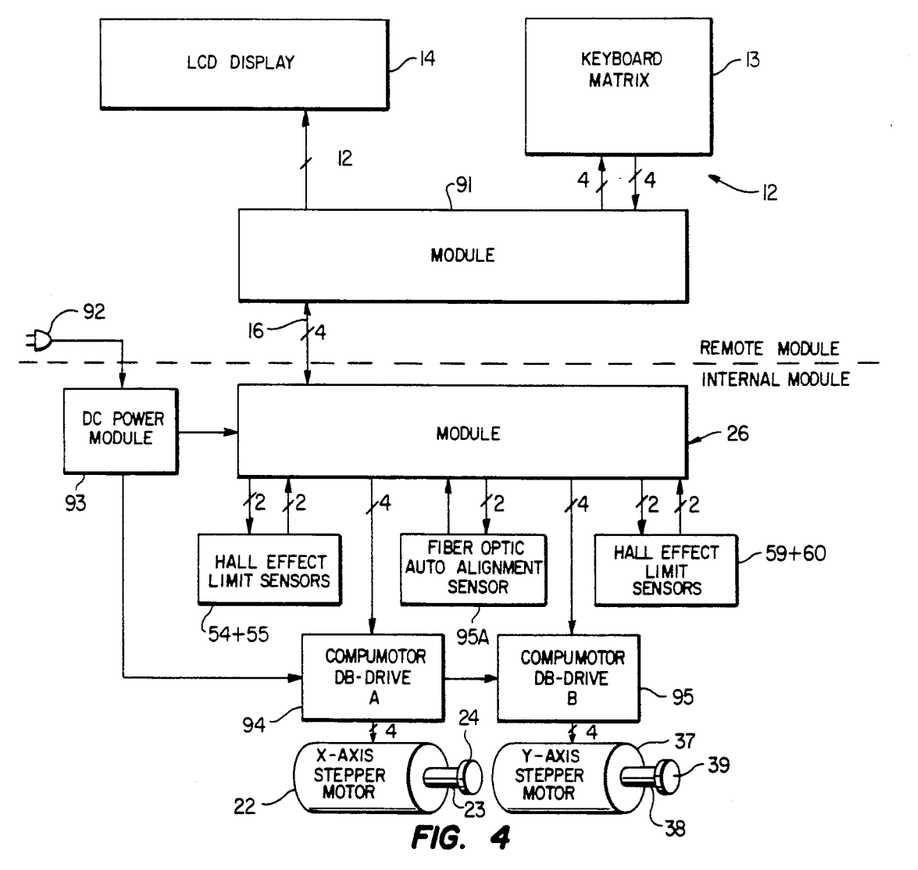
FIG. 4 is a block diagram of the control circuitry for the system of the present invention.

Referring now to FIG. 4, there is shown a block diagram of the actuation and control circuitry used to operate the system of the present invention. More specifically, the system includes the keyboard 12 in the upper portion of the figure and the internal control circuitry in the lower portion of the figure. The keyboard portion 12 includes the keyboard matrix 13 and the operator LCD display 14 connected through a control module 91. The keyboard control module 91 is connected by means of the cable 16 to the internal control module 26 including the stepper motor control circuitry. A power source 92 is connected to the DC power supply module 93 which in turn supplies power to both the control module 26 as well as to the motor driver circuits 94-95. Motor drive A 94 is connected to supply control pulses to the horizontal, of X axis stepper motor 22 while the motor drive B 95 is connected to supply control pulses to the vertical, or Y axis stepper motor 37. As discussed above in connection with FIG. 1, the X axis stepper motor includes a drive shaft 23 and a drive gear arrangement 24 while the Y axis stepper motor includes a drive shaft 38 and a drive gear 39. A plurality of Hall-effect limit sensors 54 and 55 are provided for the Y axis, while sensors 59 and 60 are provided for the X axis. Together these sensors detect the presence of both the X axis and Y axis carriages at the outer extent of their limits so as to zero reference the circuitry for operation. A fiber optic auto-alignment sensor 95A provides a similar function in detecting very precisely the location of the wafers with respect to the selection wand 52 to enable very precise positioning of the wand beneath the wafers prior to elevating the wand to select and lift a particular wafer from within an array of wafers in a boat.

Figure 5:
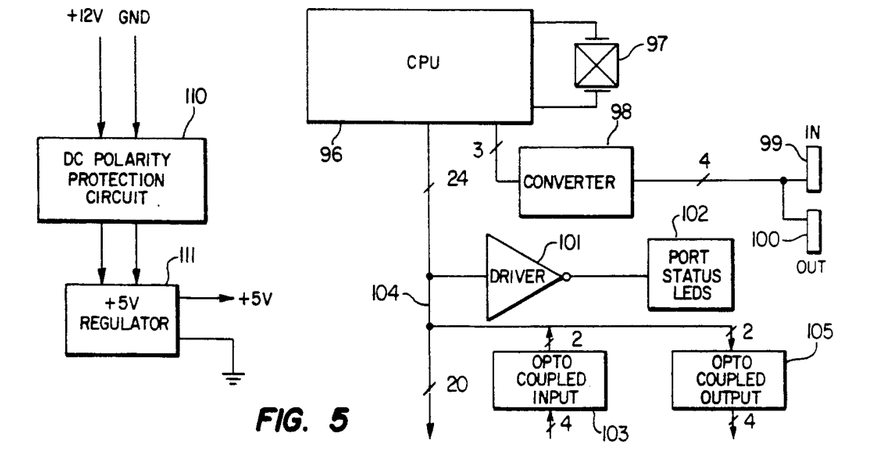
FIG. 5 is a block diagram of the input circuitry of the system of the present invention.

Referring to FIG. 5, there is shown a CPU 96 which include a RAM memory and a watchdog timer. The CPU 96 is driven by a 12 megahertz crystal 97. An RS485 converter 98 is connected to a Z-lan network input port 99 and an output port 100. A driver 101 is connected from the CPU by means of a busline 104 and is coupled to a port status LED array 102 for communication with the operator. An opto-coupled input port 103 as well as an opto-coupled output port 105 is coupled to the CPU 96 by means of the cabling 104.

The power supply circuitry for the system of the present invention includes a DC polarity protection circuit 110 which is coupled to a 5-volt regulator 111 which supplies a positive 5 volts to the circuitry for highly stable operation.

With respect to the operation of the circuitry of FIGS. 4 and 5, the wafer location, setup and sofkeys are stored in non-volatile memory within the module 26. An automatic calibration routine is actuated upon power up of the system and the distributing processing technique used in the system to allow for quick and simple servicing due to the modularity of each of the internal functions. That is, the internal modules are rail-mounted and plugged into the circuit to allow for easy changeout of the modular components during troubleshooting operations. Indicator LEDs on each internal module serve to display error and status of the module for easy problem determination. In addition, a service access port allows modification of the system's MOVE tables and its internal logic while operational within the field. Further, all motor movements and I/O functions will be manually controlled via a service port. The Hall-effect sensors protect all internal movements against outer range condition.

In the function of the system of the present invention, the location of the wafer with respect to the wafer selection wand is programmable to within 0.0001 inches and a simple to use operator interface displays error prompts for input, and displays an indication of the current wafer which has been selected for removal from the boat. An additional safety feature is that all advanced features of the system are locked out from the operator panel to prevent unwanted set up changes, and a separate maintenance terminal is plugged into the service port to allow set up and advanced calibrations. All stepper motor move sequences are also stored in a non-volatile memory to allow field changes yet protect the setup when the power is removed from the system.

The system is power input protected against reverse polarity and under-voltage, and all power and I/O connections are provided by two-piece terminal block connectors for quick connector removals for board swapout, as well as fast and easy wiring changes to each terminal. All setup parameters of the system are also stored in non-volatile RAM memory. The power supply is short circuit protected via the crowbar method, and a watchdog terminal allows quick recovery from powerouts and other problems without operator intervention. Further, 2 DE9 type connectors provide for a network interconnection to allow for easy daisychain inspection.

Figure 6A:
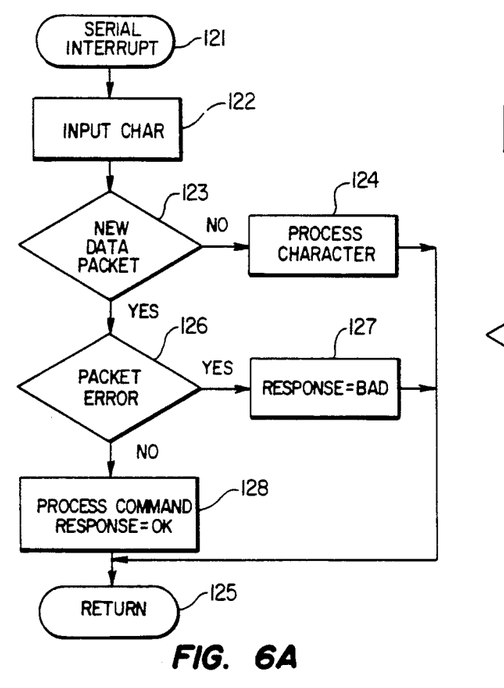
FIGS. 6A-6D are flow charts illustrating the program control of the system of the present invention.

Referring now to FIG. 6A, there is shown a flow chart illustrating the program control sequence of the program within the system which provides a serial interrupt routine. The program begins at 121 and when the character is input at 122, the system asks whether or not the new input comprises a new data packet at 123. If not, the character is processed at 124 and the system returns at 125. If at 123, it was determined that the input was a new data packet the system moves to 126 and asks whether there is packet error or not. If there is the system produces a "bad response" at 127 and returns at 125. If not, the system moves to 128 where the command is processed and an O. K. response is given to the operator.

Figure 6B:
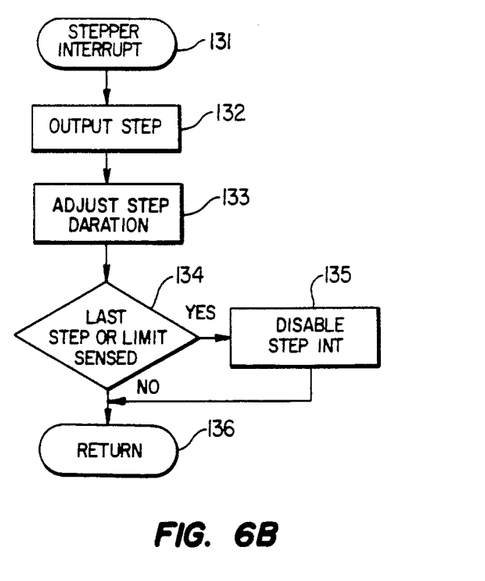

Referring to FIG. 6B, there is shown a program controlled sequence for a stepper interrupt at 131 which produces a step output at 132 and then moves to 133 where the step duration is adjusted. Next, the system asks at 134 whether that is the last step or whether a limit has been sensed or not. If so, at 135 the step is interrrupted and then returned at 136. If not, the system returns and continues to process.

Figure 6C:
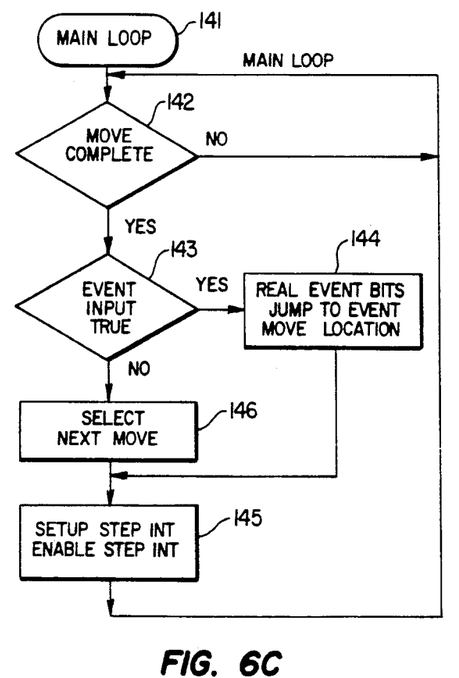

Referring now to FIG. 6C, there is shown a program control routine of the main loop of the system at 141 which asks at 142 whether the commanded move has yet been completed. If not, the system returns and continues to operate. If the move had been completed at 142, the system asks whether or not at 143 the event input is true. If so, the system moves to 144 where real event bits produces a jump-to-event and move to location action and then goes to set up a step interrupt to enable a step interrupt at 145 from which it continues on the main loop back to 142. If, however, at 143 it was determined that the event input was not true, the system moves to select the next move at 146 and thereafter sets up a step interrupt and enable interrupt at 145 and continues through the main loop back to the move completely query at 142.

Figure 6D:
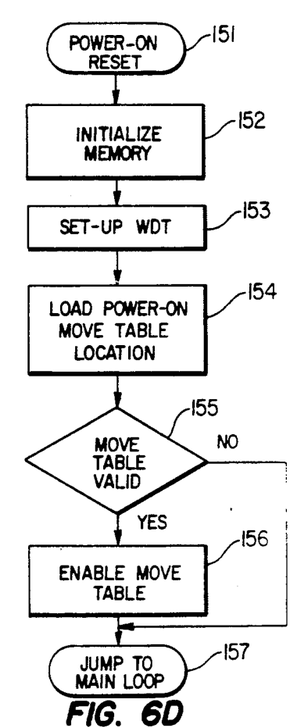

Referring next to FIG. 6D the power on reset software routine is shown at 151 which moves to 152 to initialize the memory. At 153, the system sets up the WDT and then at 154 the system loads the power on move table location. At 155 it queries as to whether or not the move table is valid or not and, if so, the move table is enabled at 156 and then the system moves to 157 and jumps to the main loop. If, however, the move table was not valid at 155, the system simply jumps to the main loop at 157.

Figure 7:
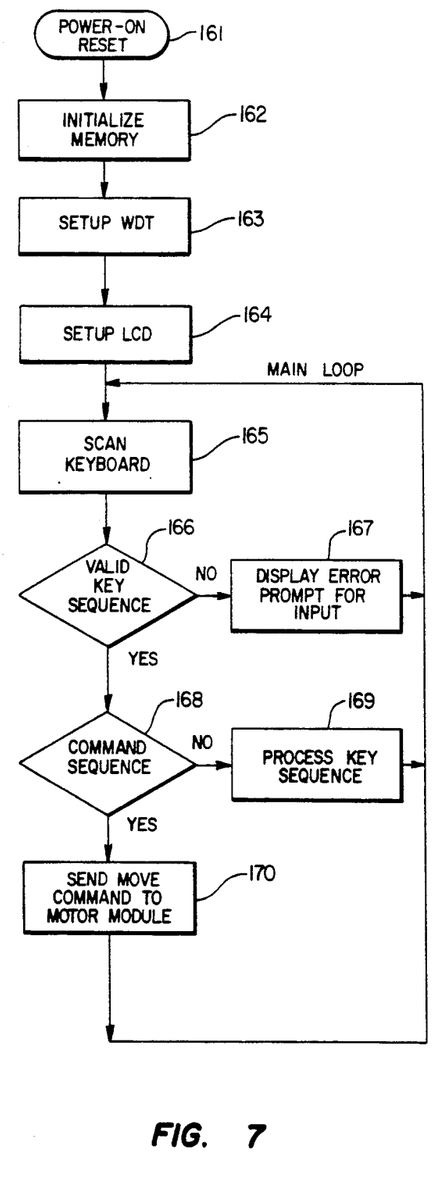
FIG. 7 is a flow chart illustrating the program operation of inputting control signals to the system of the present invention.

Referring next to FIG. 7, the power on reset flow chart is shown at 161 and the system moves to initialize the memory at 162, sets up the WDT at 163 and then sets up the LCD display at 164. Thereafter, the system scans the keyboard at 165 and queries at 166 whether the key sequence is valid. If not, the system displays the error prompt for the input at 167 and returns via the main loop to again scan the keyboard at 165. If, however, the key sequence was valid at 166, the system moves to the command query whether there is a command sequence or not at 168. If not, the system processes the key sequence at 169 and returns through the main loop to again scan the keyboard at 165. If, however, there was a command sequence at 168, the system sends the move command to the motor module at 170 before returning via the main loop to again scan the keyboard at 165.

Figure 8:
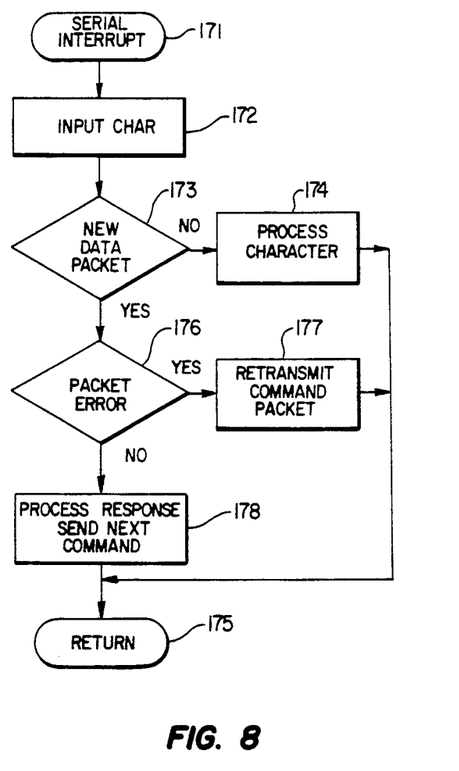
FIG. 8 is a flow chart illustrating programming of the system of the present invention.

Referring now to FIG. 8, there is shown a serial interrupt 171 which moves to 172 to input the character at 172. Next, the system asks whether there is a new data packet at 173 and if not, moves to process the character at 174 and thereafter returns at 175. If, however, there was a new data packet at 173, the system queries whether there is a packet error at 176 and, if so, moves to retransmit the command packet at 177 and then returns at 175. If, however, there was no packet error at 176, the system processes the response and sends the next command at 178 before returning at 175.

Referring now to FIG. 1 in conjunction with FIGS. 1-3 in conjunction with the control circuitry, the structure and function of which is described in connection with FIGS. 4-8, a quartz boat 65 containing a plurality of semi-conductor wafers 72 is placed on the transfer platform 63 located on the upper surface 61 of the system cabinet 11. The boat 65 is placed so that the longitudinal bars 67 and 68 are snugly fitted into the slots 76 and 77 in the elongate alignment bars 74 and 75 of the platform 63. This very precisely aligns the boat in both the longitudinal and transverse direction so that the system knows the location of each wafer 72 within the boat.

Next, a particular wafer is selected for removal from the boat for inspection and/or testing by keying in through the keyboard 12 and the keys 13 an indication of the wafer number which is desired to be selected. Once input, the system goes to a lookup table for the position of that particular wafer and sends stepping motor control information to the motor control circuit 26 to cause the horizontal drive motor 22 to rotate the shaft 23 through the gearbox 24 and the drive screw 25. The drive rotates a sufficient number of times to move the platform 31 along the drive screw 25 so that the wafer selection wand 52 is aligned immediately beneath the selected wafer 80. Once the stepper motor 22 has executed the instructions to bring the platform 31 to its proper position, signals are given to the vertical stepper motor 37 to rotate the shaft 38, and thus the drive gears 39, the timing belt 45 and the drive gear 44, to rotate the vertical drive screw 41 a preselected number of times. When the drive screw 41 rotates, the block 46 is moved upwardly to carry the wafer selection wand 51 upwardly so that the upper end thereof moves through the slot 51 in the upper framework 35 and engages the lower edge of the selected wafer 80 with the tips 84, 85 and 86 of the fingers 81, 82 and 83. The wand lifts the wafer 80 vertically upwardly in a very straight line so that it is moved to the position shown in FIG. 3 without any contact whatsoever between the selected wafer 80 and the remainder of the wafers 72 within the boat 65.

When the desired inspection and/or testing has been completed, a signal is given to the keyboard 12 so that stepper motor signals are sent to the vertical stepper motor 37 which rotates the vertical drive screw 41 to lower the wafer selection wand 52 and allow the wafer 80 to be returned back into its slots 72A in the boat 65. Thereafter, the horizontal stepper motor 22 is actuated to return the platform 31 to its home position as detected by one or more of the Hall-effect sensing devices 59 and 60.

The system must, of course, be pre-programmed for the exact position of each wafer in a particular design and configuration of wafer handling boat. This is a relatively straightforward procedure and is done with the assistance of the fiber-optic sensors associated with the wand 52 to ensure that the position of the wafers with respect to the wand is accurate to a tolerance of approximately 0.00001 inch.

As can be seen from the above description of the construction and operation of the wafer handling system of the present invention, it functions to efficiently remove any selected wafer from a wafer handling boat and elevate that wafer from within a tightly stacked array of wafers for measuring and/or testing without having any contact with any adjacent wafers to damage and/or potentially contaminate any dies carried thereon.

It is thus believed that the operation, and construction of the present invention will be apparent from the foregoing description. While the method and apparatus shown and described has been characterized as being preferred, it will be obvious that various changes and modifications may be made therein without departing from the spirit and scope of the invention as defined in the following claims.

What is claimed is:

1. A system for engaging and lifting select semi-conductor wafers from a wafer boat of the type having a framework for the underlying support of a plurality of spaced apart wafers, said system comprising:

a transfer platform adapted for receiving and matingly engaging at least one wafer boat from which said wafers are to be selectively lifted, said platform being constructed with at least one aperture therethrough for facilitating engagement and lifting of said wafers;

a wafer selection wand adapted for horizontal and vertical positioning relative to said transfer platform and for the engagement of select ones of said wafers;

means for mounting said transfer platform above said wand in a select horizontal and vertical relationship therewith;

means for positioning said wand at a select horizontal position relative to said platform mounted thereabove;

means for positioning said wand at a select vertical position relative to said platform mounted thereabove;

means for controlling said horizontal and vertical positioning means and said wand relative to said platform; and said wand including a plurality of fingers adapted for passing through said platform apertures and said wafer boat framework and having ends thereon adapted for engaging the edges of a wafer supported within said wafer boat for being lifted therefrom.

2. The system as set forth in claim 1 wherein said positioning means is disposed within a housing, said housing having an upper horizontal surface constructed with an opening therein adapted for receiving said transfer platform thereon in secured engagement therewith.

3. The system as set forth in claim 2 wherein said transfer platform is removable from said housing and said opening is constructed for receiving transfer platforms adapted to receive and matingly engage other wafer boats therein.

4. The system as set forth in claim 1 wherein said transfer platform further includes at least one bar extending across said aperture, said bar being constructed with a recess therein.

5. The system as set forth in claim 4 wherein said bars are disposed in registry with portions of said framework of said wafer boat for the underyling support thereof, and said recess is constructed for matingly receiving said framework portion therein.

6. The system as set forth in claim 1 wherein said horizontal positioning means includes a drive platform mounted for horizontal movement upon a drive screw.

7. The system as set forth in claim 6 wherein said vertical positioning means comprises a vertical drive screw mounted upon said drive platform and having a transfer carriage in threaded engagement therewith for vertical movement therealong.

8. The system set forth in claim 7 wherein said wand is coupled to said transfer carriage for select vertical movement upon rotation of said vertical drive screw.

9. The system set forth in claim 1 wherein said system further includes at least two position sensors disposed relative to said vertical positioning means for detecting the vertical position of said wand relative to said transfer platform and communicating said detected position to said control means.

10. The system set forth in claim 1 and further including a plurality of wafer engagement elements adapted for positioning on the ends of said fingers for the secured engagement of the peripheral region of said wafer in underlying support thereof.

11. The system as set forth in claim 10 wherein said wafer engagement elements form an array whose edges define portions of a substantially circular pattern.

12. The system as set forth in claim 10 wherein said wafer engagement elements each include slotted sections adapted for receving a peripheral portion of said wafer thereon.

13. The system as set forth in claim 1 wherein said vertical and horizontal positioning means includes at least one stepping motor coupled to a drive screw adapted to selectively move said wand.

14. The apparatus set forth in claim 1 wherein said transfer platform comprises a plate having an aperture formed therethrough with first and second bars disposed thereacross, said bars being constructed with elongate recesses adapted for receiving said wafer boat framework therein in precise mating engagement therewith.

15. The apparatus set forth in claim 1 wherein said control means comprises a computerized processing unit and at least one keyboard in communication therewith, said processing unit being coupled to said horizontal and vertical positioning means for the control of said positioning means from said keyboard.

16. A method for engaging and lifting select semiconductor wafers from a wafer boat of the type having a framework for the underlying support of a plurality of spaced apart wafers, said method comprising the steps of:

providing a first transfer platform adapted for receiving and matingly engaging a first wafer boat from which said wafers are to be selectively lifted;

forming at least one aperture through said platform for facilitating the lifting of said wafers;

providing a wafer selection wand adapted for horizontal and vertical positioning relative to said transfer platform;

disposing a plurality of upwardly extending fingers on said wand for passing through the framework of said wafer boat and engaging the edges of said wafer;

mounting said transfer platform above said wand in a select horizontal and vertical relationship therewith;

controlling said select horizontal and vertical positioning of said wand relative to said platform;

positioning said wand at a select horizontal position relative to said platform with said fingers in vertical alignment with a wafer thereabove; and vertically raising said wand and said fingers relative to said platform mounted thereabove and lifting a wafer from said wafer boat disposed thereon.

17. The method as set forth in claim 16 and further including the steps of:

providing a housing for said wand, said housing having an upper horizontal surface;

forming an opening in said surface adapted for receiving said transfer platform; and securing said transfer platform within said opening and above said wand disposed within said housing.

18. The method as set forth in claim 17 and further including the steps of:

removing said first transfer platform;

providing a second transfer platform adapted for a second wafer boat; and mounting said second transfer platform above said wand for the removal of wafers therefrom.

19. The method as set forth in claim 16 and further including the steps of:

providing a bar for extending across said aperture of said transfer platform;

constructing a recess within said bar for matingly receiving potions of said framework therein; and securing said bar across said aperture in registry with portions of said framework of said wafer boat for the underlying support thereof.

20. The method as set forth in claim 16 wherein said step of controlling said vertical position of said wand includes the steps of:

provi­ding at least two position sensors;

disposing said sensors relative to said platform; and detecting the vertical position of said wand relative to said transfer platform with said sensors.

* * * * *

UNITED STATES PATENT AND TRADEMARK OFFICE
CERTIFICATE OF CORRECTION

PATENT NO. : 5,153,841
DATED : October 6, 1992
INVENTOR(S) : Gerald L. Goff & Michael L. Muecke It is certified that error appears in the above-identified patent and that said Letters Patent is hereby corrected as shown below:

Column 8, line 61     delete "interrrupted"
                      insert --interrupted--

Signed and Sealed this

Fourteenth Day of September, 1993

Attest:

BRUCE LEHMAN

*Attesting Officer*     *Commissioner of Patents and Trademarks*